(12) United States Patent
Moriya

(10) Patent No.: US 12,015,037 B2
(45) Date of Patent: Jun. 18, 2024

(54) IMAGING DEVICE AND METHOD OF MANUFACTURING IMAGING DEVICE

(71) Applicant: SONY SEMICONDUCTOR SOLUTIONS CORPORATION, Kanagawa (JP)

(72) Inventor: Yusuke Moriya, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 702 days.

(21) Appl. No.: 17/044,994

(22) PCT Filed: Jan. 17, 2019

(86) PCT No.: PCT/JP2019/001262
§ 371 (c)(1),
(2) Date: Oct. 2, 2020

(87) PCT Pub. No.: WO2019/198291
PCT Pub. Date: Oct. 17, 2019

(65) Prior Publication Data
US 2021/0151484 A1   May 20, 2021

(30) Foreign Application Priority Data
Apr. 11, 2018  (JP) ................. 2018-076027

(51) Int. Cl.
*H01L 27/146* (2006.01)
*G02B 5/20* (2006.01)

(52) U.S. Cl.
CPC ........ *H01L 27/14605* (2013.01); *G02B 5/208* (2013.01); *H01L 27/14621* (2013.01); *H01L 27/14627* (2013.01); *H01L 27/14685* (2013.01)

(58) Field of Classification Search
CPC ........................ H01L 27/146–14698
See application file for complete search history.

(56) References Cited

U.S. PATENT DOCUMENTS

2009/0147101 A1* 6/2009 Tatani .............. H01L 27/14685
                                                            348/224.1
2012/0236190 A1   9/2012 Ogasahara et al.
(Continued)

FOREIGN PATENT DOCUMENTS

CN   102683363 A   9/2012
CN   105556671 A   5/2016
(Continued)

OTHER PUBLICATIONS

International Search Report and Written Opinion prepared by the Japanese Patent Office dated Mar. 25, 2019, for International Application No. PCT/JP2019/001262.

*Primary Examiner* — Bryan R Junge
(74) *Attorney, Agent, or Firm* — Sheridan Ross PC

(57) ABSTRACT

To prevent the occurrence of a defect in an infrared-light attenuation filter and prevent a reduction in image quality. An imaging device includes a photoelectric converter, an on-chip lens, a color filter, the infrared-light attenuation filter, and a protective film. The photoelectric converter performs photoelectric conversion depending on incident light. The on-chip lens collects the incident light into the photoelectric converter. Infrared light and visible light of a specified wavelength from among the collected incident light are transmitted through the color filter. The infrared-light attenuation filter attenuates the infrared light from among the collected incident light, and visible light from among the collected incident light is transmitted through the infrared-light attenuation filter. The protective film is arranged adjacent to the infrared-light attenuation filter and protects the infrared-light attenuation filter.

10 Claims, 13 Drawing Sheets

(56) References Cited

U.S. PATENT DOCUMENTS

| | | | |
|---|---|---|---|
| 2015/0200220 A1* | 7/2015 | Juenger | H01L 27/14685 438/70 |
| 2016/0080669 A1 | 3/2016 | Chou et al. | |
| 2016/0099280 A1* | 4/2016 | Huang | H01L 27/14649 438/70 |
| 2016/0293650 A1* | 10/2016 | Kimura | G02B 5/26 |
| 2017/0317132 A1* | 11/2017 | Hatakeyama | H01L 27/14 |
| 2018/0076258 A1* | 3/2018 | Hsieh | H01L 27/1462 |
| 2018/0138233 A1 | 5/2018 | Hsieh et al. | |
| 2018/0315791 A1* | 11/2018 | Hsieh | H01L 27/1462 |
| 2020/0357836 A1* | 11/2020 | Miyata | G02B 5/208 |

FOREIGN PATENT DOCUMENTS

| | | | | |
|---|---|---|---|---|
| CN | 107818995 A | | 3/2018 | |
| JP | H06217079 A | | 8/1994 | |
| JP | H1065135 A | | 3/1998 | |
| JP | 2007-329380 | | 12/2007 | |
| JP | 2012-209913 | | 10/2012 | |
| JP | 2016174028 A | | 9/2016 | |
| KR | 20100091891 A | | 8/2010 | |
| KR | 10-2012-0106560 | | 9/2012 | |
| KR | 20120106560 A | * | 9/2012 | ....... H01L 27/14621 |
| KR | 10-2016-0052540 | | 5/2016 | |
| WO | WO-2018043654 A1 | | 3/2018 | |

\* cited by examiner

IMAGING DEVICE AND METHOD OF MANUFACTURING IMAGING DEVICE

CROSS REFERENCE TO RELATED APPLICATIONS

This application is a national stage application under 35 U.S.C. 371 and claims the benefit of PCT Application No. PCT/JP2019/001262 having an international filing date of 17 Jan. 2019, which designated the United States, which PCT application claimed the benefit of Japanese Patent Application No. 2018-076027 filed 11 Apr. 2018, the entire disclosures of each of which are incorporated herein by reference.

TECHNICAL FIELD

The present disclosure relates to an imaging device and a method of manufacturing the imaging device. In particular, the present disclosure relates to an imaging device including a filter that attenuates infrared light, and a method of manufacturing the imaging device.

BACKGROUND ART

Conventionally, the imaging device collects incident light using an on-chip lens, and performs photoelectric conversion according to the incident light. An imaging device is used that includes a color filter and as infrared-light attenuation filter, the color filter being a filter through which infrared light and visible light of a specified wavelength from among the collected incident light are transmitted, the infrared-light attenuation filter being a filter that attenuates infrared light from among the collected incident light and through which visible light from among the collected incident light is transmitted.

For example, such a technology is disclosed in Patent Literature 1.

CITATION LIST

Patent Literature

Patent Literature 1: Japanese Patent Application Laid-open No. 2016-177273

DISCLOSURE OF INVENTION

Technical Problem

A solid-state imaging device having a configuration in which an infrared-light attenuation filter, a color filter for visible light, and an on-chip lens are sequentially stacked, and visible light and infrared light are transmitted using the on-chip lens, is disclosed as the related art described above. A coloring material made of an organic dye having a high degree of freedom in spectral design, is often used for an infrared-light attenuation filter. The solid-state imaging device has a problem in which the surface roughness of an infrared-light attenuation filter is produced in the stacking process. When the infrared-light attenuation filter is processed, a coloring material of the infrared-light attenuation filter dissolves in a chemical solution, and a loophole is created in the infrared-light attenuation filter. There is a problem in which, when a color filter is stacked on the infrared-light attenuation filter, material of the color filter enters the loophole and a point defect occurs, which results in a reduction is image quality.

The present disclosure has been achieved in view of the problems described above, and it is an object of the present disclosure to prevent the occurrence of a defect in an infrared-light attenuation filter and to prevent a reduction in image quality.

Solution to Problem

The present disclosure has been achieved to solve the problems described above, and a first aspect of the present disclosure is an imaging device that includes a photoelectric converter that performs photoelectric conversion depending on incident light; an on-chip lens that collects the incident light into the photoelectric converter; a color filter through which infrared light and visible light of a specified wavelength from among the collected incident light are transmitted; an infrared-light attenuation filter that attenuates the infrared light from among the collected incident light and through which visible light from among the collected incident light is transmitted; and a protective film that is arranged adjacent to the infrared-light attenuation filter and protects the infrared-light attenuation filter.

Further, in the first aspect, the protective film may be arranged adjacent to the color filter, and the infrared-light attenuation filter may attenuate the infrared light transmitted through the color filter.

Further, in the first aspect, the protective film may protect the infrared-light attenuation filter when the color filter is formed.

Further, in the first aspect, the protective film may have substantially the same refractive index as the color filter.

Further, in the first aspect, the protective film may be arranged adjacent to the on-chip lens, the color filter may be arranged adjacent to the infrared-light attenuation filter, and the visible light of the specified wavelength from among the incident light transmitted through the infrared-light attenuation filter, may be transmitted through the color filter.

Further, in the first aspect, the protective film may protect the infrared-light attenuation filter when the on-chip lens is formed.

Further, in the first aspect, a pixel that includes the photoelectric converter, the on-chip lens, the color filter, the infrared-light attenuation filter, and the protective film; and an infrared-light pixel that includes an infrared-light transmission filter through which the infrared-light from among the collected incident light is transmitted, the photoelectric converter, and the on-chip lens may be further included, and the protective film may be further arranged on a face of the infrared-light attenuation filter that is adjacent to the infrared-light pixel.

Further, in the first aspect, the protective film may be made of an organic material.

Further, in the first aspect, the protective film may be made of an inorganic material.

Further, in the first aspect, the protective film may be formed by stacking an organic material and an inorganic material.

Further, a second aspect of the present disclosure is a method of manufacturing an imaging device, the method including forming a photoelectric converter that performs photoelectric conversion depending on incident light; forming an on-chip lens that collects the incident light into the photoelectric converter; forming a color filter through which infrared light and visible light of a specified wavelength from among the collected incident light are transmitted;

forming an infrared-light attenuation filter that attenuates the infrared light from among the collected incident light and through which visible light from among the collected incident light is transmitted; and forming a protective film that is arranged adjacent to the infrared-light attenuation filter and protects the infrared-light attenuation filter.

Due to such aspects, a protective film is arranged on the surface of an infrared-light attenuation filter in the imaging device of the present disclosure. The infrared-light attenuation filter is expected to be protected by the protective film.

Advantageous Effects of Invention

The present disclosure provides an excellent effect of preventing the occurrence a defect in an infrared-light attenuation filter and preventing a reduction in image quality.

MODE(S) FOR CARRYING OUT THE INVENTION

Next, modes for carrying out the present disclosure (hereinafter referred to as embodiments) will be described with reference to the drawings. In the accompanying drawings, the same or similar portions will be denoted by the same or similar reference symbols. However, the figures are schematic ones, and, for example, a ratio of dimensions of respective components is not necessarily the same as the actual one. Further, of course, a certain figure and another figure have different dimensional relationships and different ratios of dimensions with. respect to the same portion. Moreover, the embodiments will be described in the following order.

Figure 1:
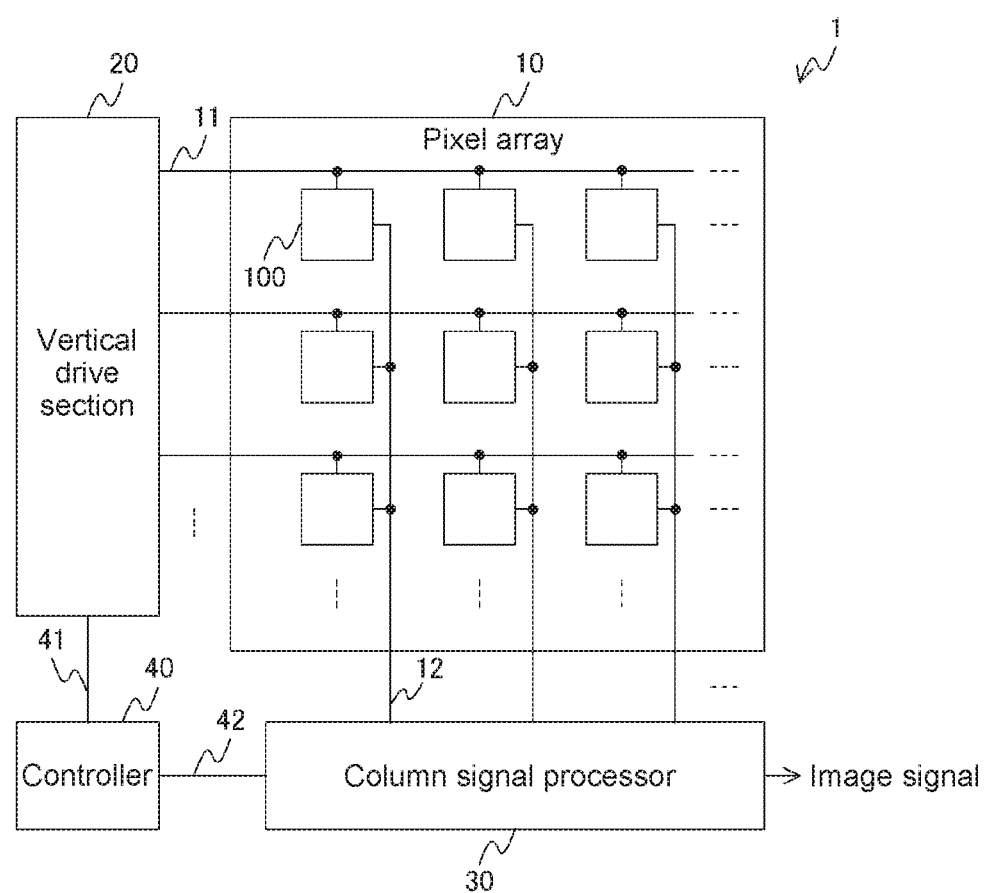
FIG. 1 illustrates a configuration example of an imaging device according to embodiments of the present disclosure.

1. First Embodiment
2. Second Embodiment
3. Third Embodiment
4. Fourth Embodiment
5. Fifth Embodiment
  6. Example of Application to Camera 1. First Embodiment Configuration of Imaging Device FIG. 1 illustrates a configuration example of an imaging device according to embodiments of the present disclosure. An imaging device 1 in the figure includes a pixel array 10, a vertical drive section 20, a column signal processor 30, and a controller 40.

The pixel array 10 includes pixels 100 arranged in a two-dimensional grid. Here, the pixel 100 generates an image signal depending on irradiated light. The pixel 100 includes a photoelectric converter that generates a charge depending on irradiated light. The pixel 100 further includes a pixel circuit. The pixel circuit generates an image signal based on a charge generated by the photoelectric converter. The generation of an image signal is controlled by a control signal generated by the vertical drive section 20 described later. The pixel array 10 includes signal lines 11 and 12 arranged in an XY matrix. The signal line 11 is a signal line that transmits a control signal for the pixel circuit in the pixel 100. The signal line 11 is arranged for each row of the pixel array 10 and wired in common with respect to the pixels 100 arranged in each row. The signal line 12 is a signal line that transmits an image signal generated by the pixel circuit of the pixel 100. The signal line 12 is arranged for each column of the pixel array 10 and wired in common with respect to the pixels 100 arranged in each column. The photoelectric converter and the pixel circuit are formed in a semiconductor substrate.

The vertical drive section 20 generates a control signal for the pixel circuit of the pixel 100. The vertical drive section 20 transmits the generated control signal to the pixel 100 through the signal line 11 in the figure. The column signal processor 30 processes an image signal generated by the pixel 100. The column signal processor 30 processes the image signal transmitted from the pixel 100 through the signal line 12 in the figure. The processing performed by the column signal processor 30 corresponds to, for example, an analog-to-digital conversion that converts an analog image signal generated in the pixel 100 into a digital image signal. The image signal processed by the column signal processor 30 is output as an image signal of the imaging device 1. The controller 40 controls the entire imaging device 1. The controller 40 controls the imaging device 1 by generating and outputting a control signal used to control the vertical drive section 20 and the column signal processor 30. The control signal generated by the controller 40 is transmitted to the vertical drive section 20 and the column signal processor 30 respectively through signal lines 41 and 42.

Configuration of Pixel

Figure 2:
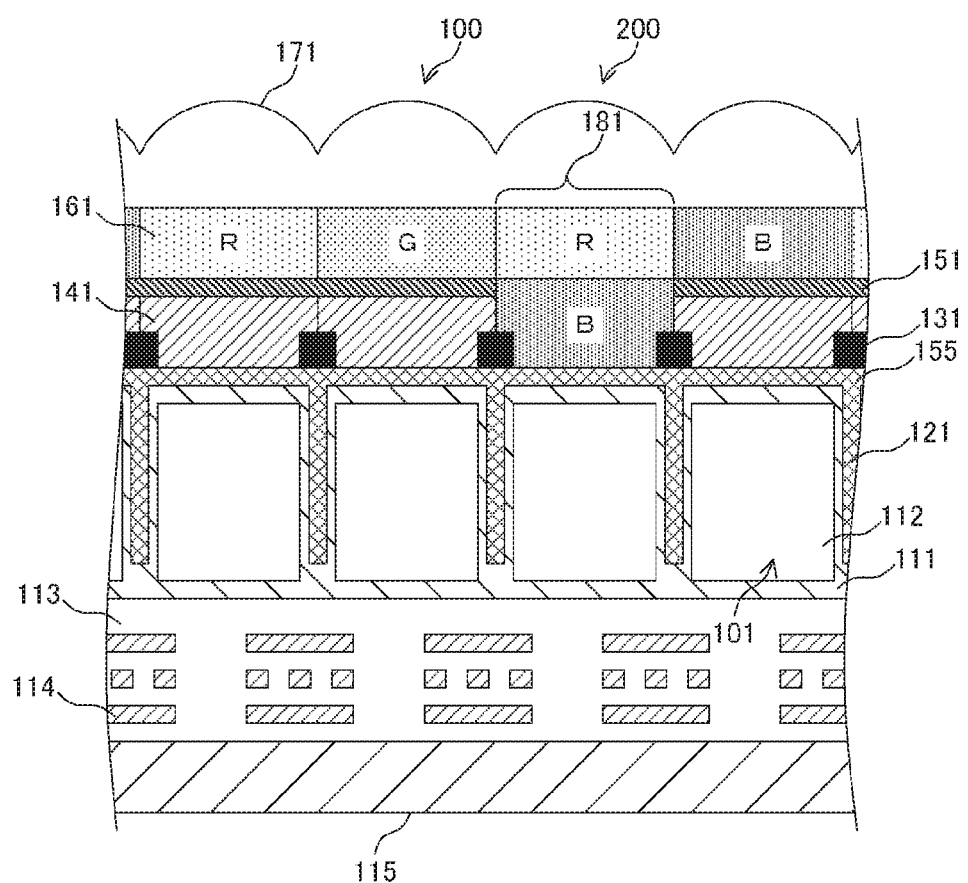
FIG. 2 illustrates a configuration example of a pixel according to a first embodiment of the present disclosure.

FIG. 2 illustrates a configuration example of a pixel according to a first embodiment of the present disclosure. The figure is a schematic cross-sectional view illustrating a configuration of a pixel 100 arranged in the pixel array 10.

Note that an infrared-light pixel 200 is further arranged in the pixel array 10 in the figure.

The pixel 100 includes an on-chip lens 171, a color filter 161, a protective film 151, an infrared-light attenuation filter 141, a light-blocking film 131, a semiconductor substrate 111, an insulation layer 113, a wiring layer 114, and a support substrate 115.

The semiconductor substrate 111 is a semiconductor substrate in which semiconductor portions of the photoelectric converter and the pixel circuit that are included in the pixel 100 and described with reference to FIG. 1. Semiconductor portions of the vertical drive section 20, the column signal processor 30, and the controller 40 are further formed in the semiconductor substrate 111. The figure illustrates the photoelectric converter 101 of the pixel 100 from among the components described above. For convenience, the semiconductor substrate 111 in the figure is assumed to be formed as a p-type well region. The photoelectric converter 101 is formed of an n-type semiconductor region 112 and a p-type well region surrounding the n-type semiconductor region 112. Photoelectric conversion depending on incident light is performed in a p-n junction formed at an interface between the n-type semiconductor region 112 and the p-type well region, and a charge generated by the photoelectric conversion is held in the n-type semiconductor region 112. An image signal is generated by the pixel circuit (not illustrated) on the basis of the charge generated by the photoelectric conversion performed by the photoelectric converter 101.

Note that a pixel separation portion 121 is arranged between the pixels 100 in the semiconductor substrate 111. The pixel separation portion 121 is a region that prevents the movement of a charge between the pixels 100. Further, an insulation film 155 is arranged on a back surface of the semiconductor substrate 111. In addition to the photoelectric converter 101 and the pixel circuit, the vertical drive section 20, the column signal processor 30, and the controller 40 (none of them are illustrated) are formed in the semiconductor substrate 111.

The wiring layer 114 is wiring used to transmit an image signal generated in the pixel 100 and a control signal used to control the pixel circuit. The wiring layer 114 makes up the signal lines 11 and 12 described with reference to FIG. 1. Further, the wiring layers 114 are insulated from each other by the insulation layer 113. Note that the imaging device 1 including the pixel 100 in the figure is a backside-irradiation imaging device in which the wiring layer 114 is arranged on a surface of the semiconductor substrate 111 that is different from a surface from which light enters.

The on-chip lens 171 is a lens that collects incident light into the photoelectric converter 101. The on-chip lens 171 causes incident light to enter the photoelectric converter 101 through the color filter 161 and the infrared-light attenuation filter 141. The on-chip lens 171 may be made of, for example, resin.

The color filter 161 is an optical filter through which visible light of a specified wavelength from among visible light is transmitted. Here, the visible light corresponds to, for example, light of a wavelength of from 380 nm to 750 nm. For example, three types of color filters through which red light (a wavelength of 700 nm), green light (a wavelength of 546 nm), and blue light (436 nm) are respectively transmitted may be used as the color filter 161. Pieces of visible light of corresponding wavelengths are respectively transmitted through these color filters 161. On the other hand, infrared light is transmitted through the color filter 161. Here, the infrared light corresponds to, for example, light of a wavelength of from 750 nm to 1200 nm. The character given to the color filter 161 in the figure indicates the type of the color filter 161. Specifically, the color filters 161 with "R", "G" and "B" respectively correspond to the color filters 161 through which red light, green light, and blue light are respectively transmitted.

The infrared-light attenuation filter 141 is an optical filter that attenuates infrared light of a specific wavelength from among infrared light. For example, the infrared-light attenuation filter 141 attenuating infrared light of a wavelength of 850 nm or the infrared-light attenuation filter 141 attenuating infrared light of a wavelength of 940 nm may be used as the infrared-light attenuation filter 141. These infrared-light attenuation filters 141 respectively attenuate pieces of infrared light of corresponding wavelengths to remove the respective pieces of infrared light. In other words, from among infrared light, infrared light of a wavelength other than a corresponding wavelength is transmitted through the infrared-light attenuation filter 141. On the other hand, visible light is transmitted through the infrared-light attenuation filter 141.

The arrangement of the infrared-light attenuation filter 141 in the pixel 100 makes it possible to prevent color mixture caused by infrared light. Here, the color mixture is a phenomenon in which an error in an image signal is caused by light of a wavelength different from a desired wavelength entering the pixel 100. The arrangement of the stacked color filter 161 and infrared-light attenuation filter 141 in the pixel 100 makes it possible to cause visible light of a specified wavelength from among light entering the pixel 100 to be transmitted and to attenuate infrared light of a specific wavelength from among the light entering the pixel 100. Further, by stacking the infrared-light attenuation filter 141 and the color filter 161 in the pixel 100, it is possible to make the thicknesses of the infrared-light pixel 200 described later and the pixel 100 uniform, and thus to prevent a difference in level from being caused. This results in a reduction in luminance unevenness.

For example, an infrared-light attenuation filter obtained by dispersing, in resin, a dye-based coloring material made of an organic dye is used as the infrared-light attenuation filter 141. The use of such an infrared-light attenuation filter makes it possible to improve a degree of freedom in spectral design. However, in the infrared-light attenuation filter 141, the coloring material agglomerates upon hardening resin, and this results in forming a relatively large agglomerate. When the infrared-light attenuation filter 141 in which the agglomerate is formed is processed, the agglomerate dissolves to create a loophole. When the color filter 161 is stacked thereon, the color filter 161 enters the loophole, and this results in increasing a point defect in visible light. Further, an effective thickness of the infrared-light attenuation filter 141 is reduced due to the dissolution of a coloring material. The dissolution of an agglomerate of the infrared-light attenuation filter 141 will be described later in detail.

The protective film 151 is arranged on the surface of the infrared-light attenuation filter 141, and protects the infrared-light attenuation filter 141. The protective film 151 in the figure protects the infrared-light attenuation filter 141 when the color filter 161 is formed on the infrared-light attenuation filter 141. It is necessary that the protective film 151 be made of material insoluble in a developer or a stripping solution of a resist that is used when the infrared-light attenuation filter 141 and the like are processed. Further, it is favorable that the protective film 151 exhibit a transmittance of 80% or more in a visible range of a wavelength of from 400 nm to 700 nm. This is for preventing a reduction in the sensitivity of the pixel 100. For example, the protective film 151 may have a thickness greater than 1 nm.

The protective film 151 may be made of an inorganic material such as $SiO_2$, SiN, SiON, SiCN, and SiOC. In this case, it is possible to form the protective film 151 using atomic layer deposition (ALD), chemical vapor deposition (CVD), or physical vapor deposition (PVD) such as sputtering and vacuum evaporation. The use of the protective film 151 made of an inorganic material makes it possible to prevent oxygen from entering the infrared-light attenuation filter 141, and thus to suppress the degradation of the infrared-light attenuation filter 141. Note that, when the protective film 151 is made of an inorganic material, it is favorable to adopt, for example, a material or a manufacturing method in which a temperature at the time of forming the film is 260° C. or less. The reason is that it is possible to prevent the degradation of the infrared-light attenuation filter 141 due to heating.

Further, the protective film 151 may also be made of an organic material such as an acrylic resin, a styrene resin, a siloxane resin, an epoxy resin, and a cyclic olefin resin. In this case, a thermosetting resin or a photocurable resin may be used for the protective film 151.

Note that the protective film 151 may have a multi-layer structure, or may be a composite film made of an inorganic material and an organic material.

Further, it is favorable that the protective film 151 be made of material having substantially the same refractive index as the color filter 161. The reason is that it is possible to reduce the reflection of incident light at an interface between the color filter 161 and the protective film 151 and to improve the sensitivity. Further, it is also possible to reduce the reflection of incident light when a value intermediate between the refractive indexes of the color filter 161 and the infrared-light attenuation filter 141 is set to be the refractive index of the protective film 151.

The light-blocking film 131 is a film that is arranged at a boundary of the pixels 100 on the surface of the semiconductor substrate 111 and blocks light transmitted through the color filter 161 of an adjacent pixel 100.

The infrared light pixel 200 is a pixel that generates an image signal depending on infrared light from among incident light. The infrared-light pixel 200 is different from the pixel 100 in that a visible-light attenuation filter 181 is arranged instead of the color filter 161 and the infrared-light attenuation filter 141. The visible-light attenuation filter 181 in the figure is formed by stacking a plurality of color filters. Specifically, the visible-light attenuation filter 181 is formed of a color filter that is formed in the same layer as the infrared-light attenuation filter 141 and through which blue light is transmitted, and a color filter that is formed in the same layer as the color filter 161 and through which red light is transmitted.

Protective Film

Figure 3:
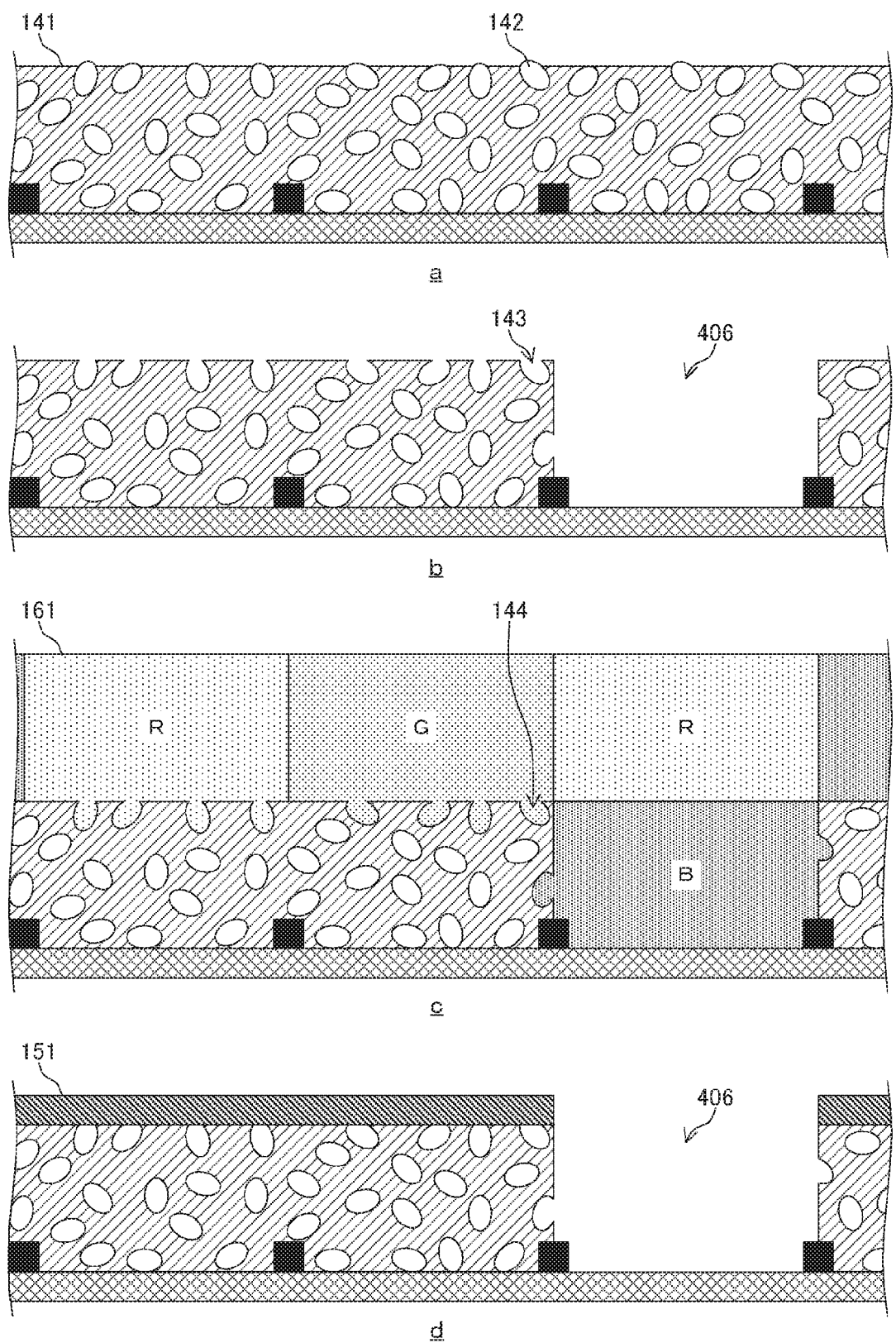
FIG. 3 illustrates a configuration example of a protective film according to embodiments of the present disclosure.

FIG. 3 illustrates a configuration example of a protective film according to embodiments of the present disclosure. The figure is a diagram describing an effect provided by the protective film 151 when the infrared-light attenuation filter 14 is processed and when the color filter 161 is formed a of the figure illustrates a state in which the infrared-light attenuation filter 141 is formed on the insulation film 155. Resin that is material of the infrared-light attenuation filter 141 is applied to the insulation film 155, and then, the resin is heated and hardened to form the infrared-light attenuation filter 141. An agglomerate 142 of a coloring material illustrated in a of the figure is formed when the hardening is performed.

Next, an opening 406 is formed an the infrared-light attenuation filter 141 in order to form the visible-light attenuation filter 181 described above. A resist that includes an opening at a position at which the opening 406 is to be formed, is formed on the surface of the infrared-light attenuation filter 141, and etching is performed on the infrared-light attenuation filter 141 using the resist as a mask. Accordingly, the opening 406 can be formed. After etching is performed on the infrared-light attenuation filter 141, the resist is removed using a solvent. The agglomerate 142 dissolves in the solvent in the process of removing the resist. A loophole 143 in b of the figure is a hole created by the dissolution of the agglomerate 142. Note that, even if the infrared-light attenuation filter 141 is not processed, the loophole 143 will also be formed due to a solvent used when the color filter 161 described later is formed.

Next, a color filter is arranged in the opening 406, and the color filter 161 is stacked thereon. This process results in the material of the color filter entering the loophole 143. c of the figure illustrates this state, and a loophole 144 in c of the figure represents a loophole that a color filter has entered. The loophole 144 becomes a point defect, and this results in luminance unevenness in an image signal generated by the pixel 100. Further, luminance unevenness also shows up when the state of dissolution of the agglomerate 142 differs for each pixel 100. This results in a reduction in image quality. Further, an effective thickness of the infrared-light attenuation filter 141 is reduced due to dissolution of a coloring material. Thus, there is a need to form the infrared-light attenuation filter 141 of a thickness obtained by anticipating that there is a reduction in thickness. When the thickness of the infrared-light attenuation filter 141 is increased, the sensitivity is reduced and color mixture is increased due to an increase in obliquely incident light entering from an adjacent pixel 100. There is also a reduction in image quality in this case.

Thus, is the present disclosure, the protective film 151 is arranged on the surface of the infrared-light attenuation filter 141 to protect the infrared-light attenuation filter 141. d of the figure illustrates a case of arranging the protective film 151. The protective film 151 is stacked on the surface of the infrared light attenuation filter 141, and then, the opening 406 is formed. This makes it possible to prevent the agglomerate 142 from dissolving from the surface of the infrared-light attenuation filter 141. Since the loophole 143 described above is not formed, it is possible to prevent, for example, an increase in a point defect. Further, since it is possible to reduce the thickness of the infrared-light attenuation filter 141, it is possible to prevent a reduction in sensitivity and an increase in color mixture.

Further, it is possible to improve the strength of adhesion of the color filter 161 by the protective film 151 being arranged to underlie the color filter 161. It is possible to reduce the occurrence of a problem such as peeling of the color filter 161. In particular, when the protective film 151 to is made of an organic material such as an acrylic resin, it is possible to achieve a high strength of adhesion to the color filter 161.

Method of Manufacturing Imaging Device

Figure 4:
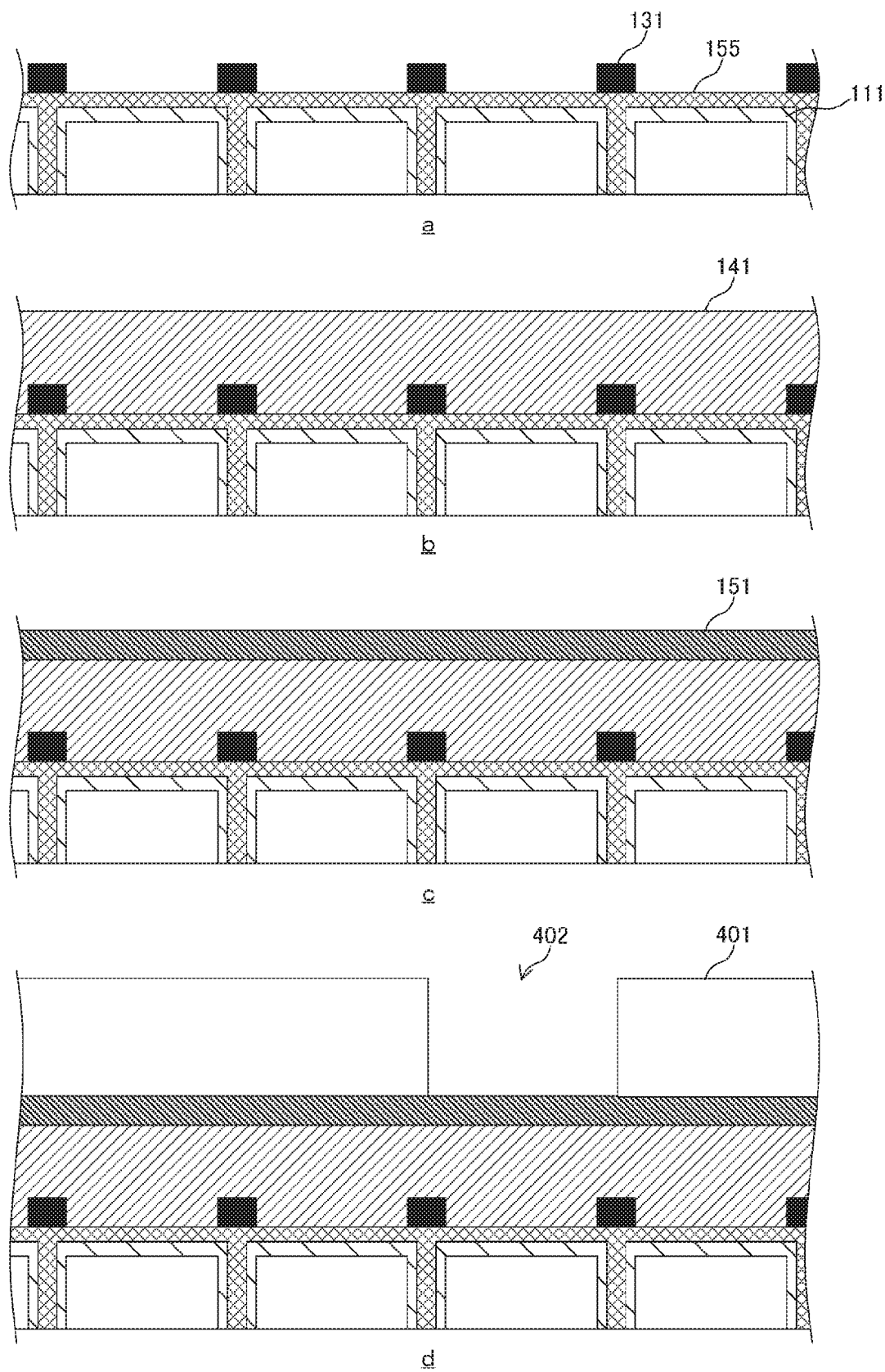
FIG. 4 illustrates an example of a method of manufacturing the imaging device according to the first embodiment of the present disclosure.
Figure 5:
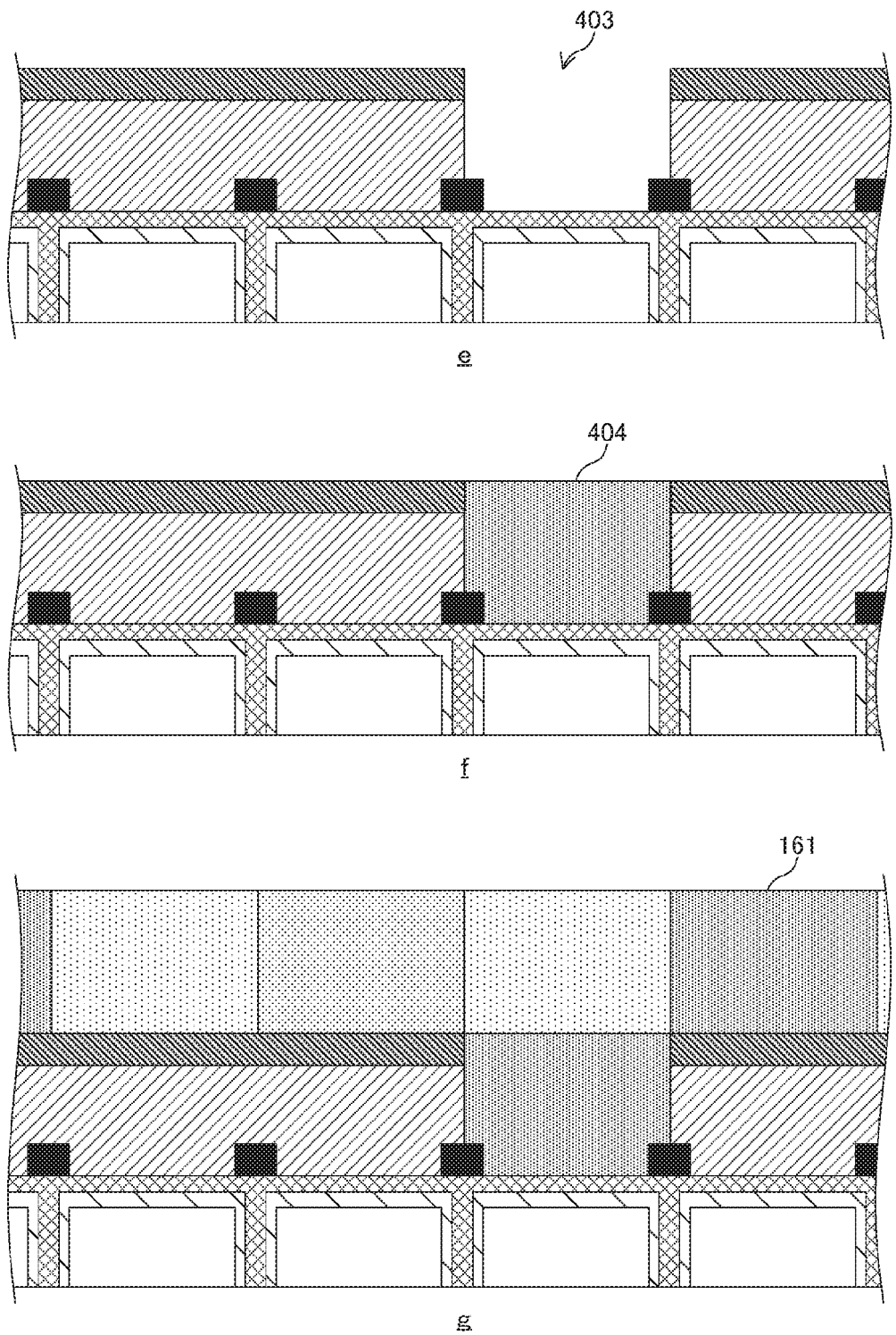
FIG. 5 illustrates the example of the method of manufacturing the imaging device according to the first embodiment of the present disclosure.
Figure 6:
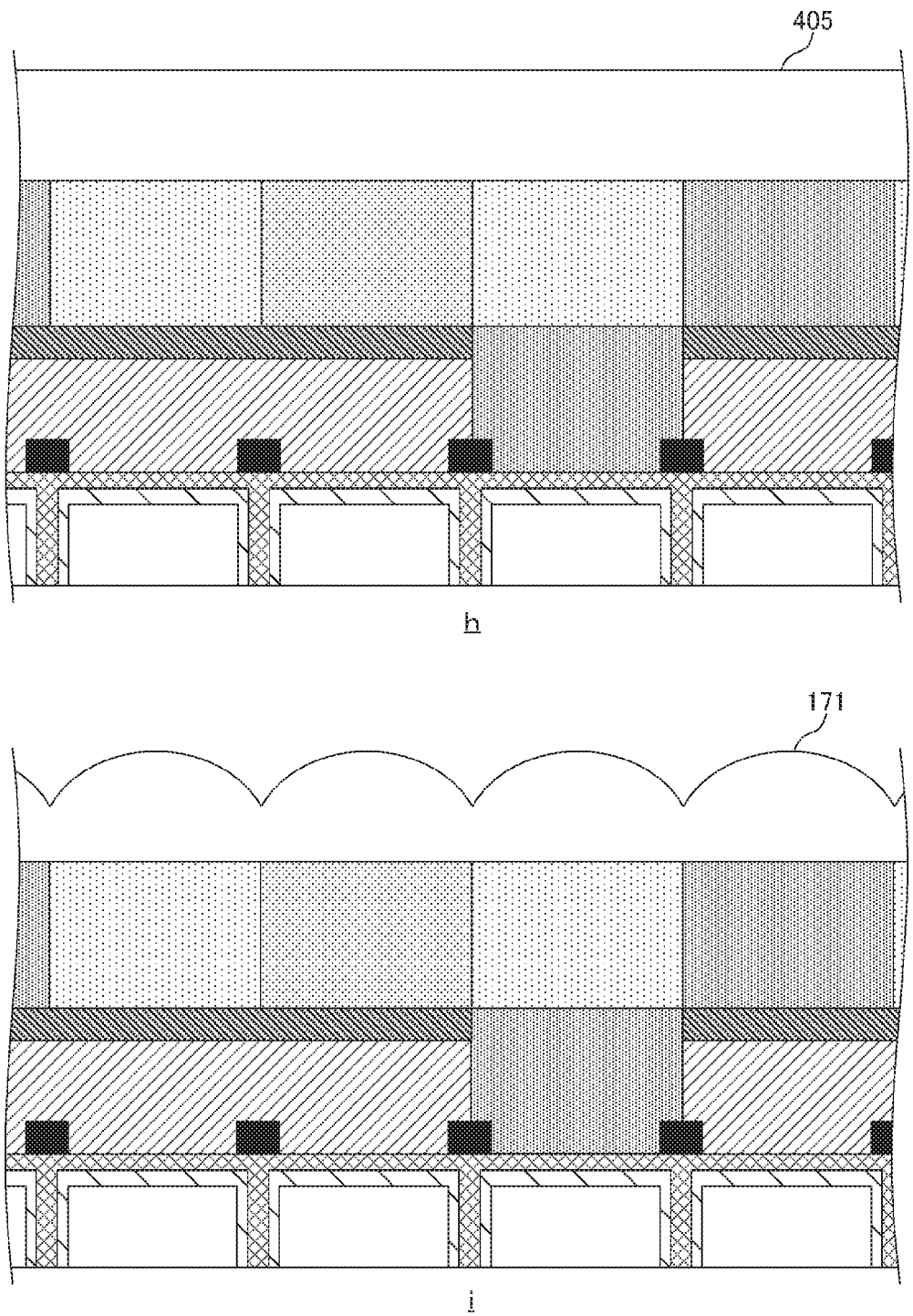
FIG. 6 illustrates the example of the method of manufacturing the imaging device according to the first embodiment of the present disclosure.

FIGS. 4 to 6 illustrate a method of manufacturing an imaging device according to the first embodiment of the present disclosure. A process of manufacturing the imaging device 1 described with reference to FIG. 2 is described using FIGS. 4 to 6. Note that the protective film 151 is assumed to be made of an organic material.

First, as illustrated in a of FIG. 4, the pixel separation portion 121 and the insulation film 155 are formed in the semiconductor substrate 111 in which the photoelectric converter 101 is formed. For example, this can be performed as indicated below. First, a trench is formed in a region between the pixels 100 in the semiconductor substrate 111. Next, a film of an insulator is formed on the surface of the semiconductor substrate 111 in which the trench is formed. For example, CVD can be used for the film formation. Accordingly, it is possible to arrange an insulator in the trench and to form a film of the insulator on the surface of the semiconductor substrate 111. This results in being able to form the pixel separation portion 121 and the insulation film 155 at the same time. Next, the light-blocking film 131 is arranged on the surface of the insulation film 155. For example, this can be performed as indicated below. A material film of the light-blocking film 131 is formed on the surface of the insulation film 155, and etching is performed to remove the material film formed in a region other than a region situated at a boundary of the pixels 100.

Next, as illustrated in b of FIG. 4, the infrared-light attenuation filter 141 is formed on the surfaces of the insulation film 155 and the light-blocking film 131. This can be performed, for example, by applying and hardening resin that is material of the infrared-light attenuation filter 141. This process is an example of forming an infrared-light attenuation filter according to an embodiment of the present disclosure.

Next, as illustrated in c of FIG. 4, the protective film 151 is formed adjacent to the infrared-light attenuation filter 141. This process is an example of forming a protective film according to an embodiment of the present disclosure. Note that the surface of the infrared-light attenuation filter 141 may be reformed before the protective film 151 is formed. This can be performed, for example, by performing asking processing.

Next, as illustrated in d of FIG. 4, a resist 401 is applied such that the resist 401 is adjacent to the protective film 151. Next, an opening 402 is formed in the resist 401. This can be performed using lithography.

Next, as illustrated in e of FIG. 5, etching is performed on the protective film 151 and the infrared-light attenuation filter 141 using the resist 401 as a mask. This can be performed using dry etching. Note that the etching is performed until the resist 401 is removed. This results in forming an opening 403 in the protective film 151 and the infrared-light attenuation filter 141.

Next, as illustrated in f of FIG. 5, a color filter through which blue light is transmitted is formed in an opening 404. This can be formed by applying a photosensitive resin that is material of a color filter and by performing exposure and development on the applied photosensitive resin.

Next, as illustrated in g of FIG. 5, the color filter 161 is formed. This can be formed by performing a process including applying, exposing, and developing a photosensitive resin that is material of a color filter for each type of the color filter 161. This process is an example of forming a color filter according to an embodiment of the present disclosure.

Next, as illustrated in h of FIG. 6, a resin film 405 that is material of an on-chip lens is applied. Next, as illustrated in i of FIG. 6, the surface of the resin film 405 is processed into a hemispherical shape. For example, this can be performed as indicated below. A resist having the same shape as the on-chip lens 171 is formed on the surface of the resin film 405, dry etching is performed, and the shape of the resist is transferred to the resin film 405. This process is an example of forming an on-chip lens according to an embodiment of the present disclosure.

The processes described above make it possible to manufacture the imaging device 1. The surface of the infrared-light attenuation filter 141 is protected by the protective film 151 through the processes of e, f, and g of FIG. 5.

As described above, in the imaging device 1 according to the first embodiment of the present disclosure, by the protective film 151 being arranged adjacent to the infrared-light attenuation filter 141, it is possible to prevent the occurrence of a defect in the infrared-light attenuation filter 141, and thus to prevent a reduction in image quality.

2. Second Embodiment

In the imaging device 1 of the first embodiment described above, the protective film 151 is arranged adjacent to the infrared-light attenuation filter 141. On the other hand, the imaging device 1 of a second embodiment of the present disclosure is different from the first embodiment described above in further including a protective film 152.

Configuration of Pixel

Figure 7:
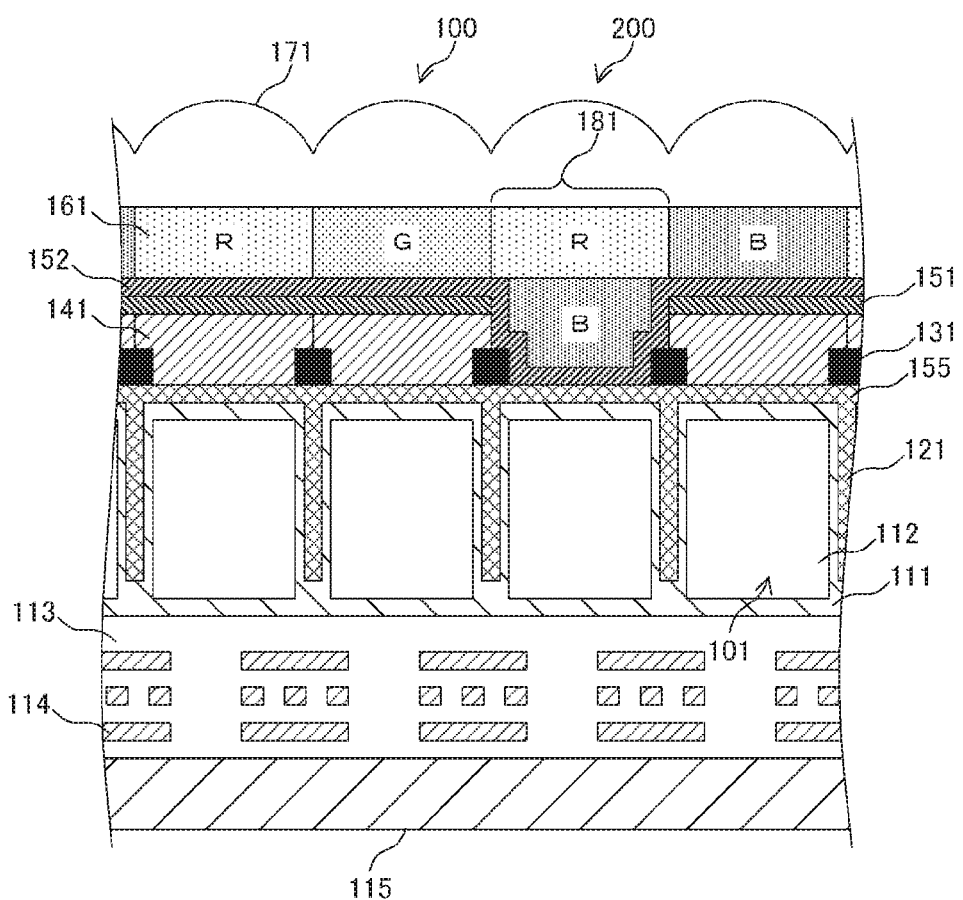
FIG. 7 illustrates a configuration example of a pixel according to a second embodiment of the present disclosure.

FIG. 7 illustrates a configuration example of a pixel according to the second embodiment of the present disclosure. The pixel 100 in the figure is different from the pixel 100 described with reference to FIG. 2 in further including the protective film 152.

The protective film 152 is arranged between the protective film 151 and the color filter 161, and protects the infrared-light attenuation filter 141. The protective film 152 is further arranged on a face of the infrared-light attenuation filter 141 that is adjacent to the infrared-light pixel 200, and protects the lateral face of the infrared-light attenuation filter 141 when the infrared-light attenuation filter 141 processed. The protective film 152 may be made of material similar to that of the protective film 151. For example, the protective film 151 may be made of $SiO_2$, and the protective film 152 may be made of SiN. Further, the protective films 151 and 152 may be respectively made of an inorganic material and an organic material. In this case, the protective film 151 made of an inorganic material may be used as a mast in the process of performing etching on the infrared-light attenuation filter 141. This process will be described later. Further, the use of the protective film 152 made of an organic material makes it possible to improve the strength of adhesion to the color filter 161.

Method of Manufacturing Imaging Device

Figure 8:
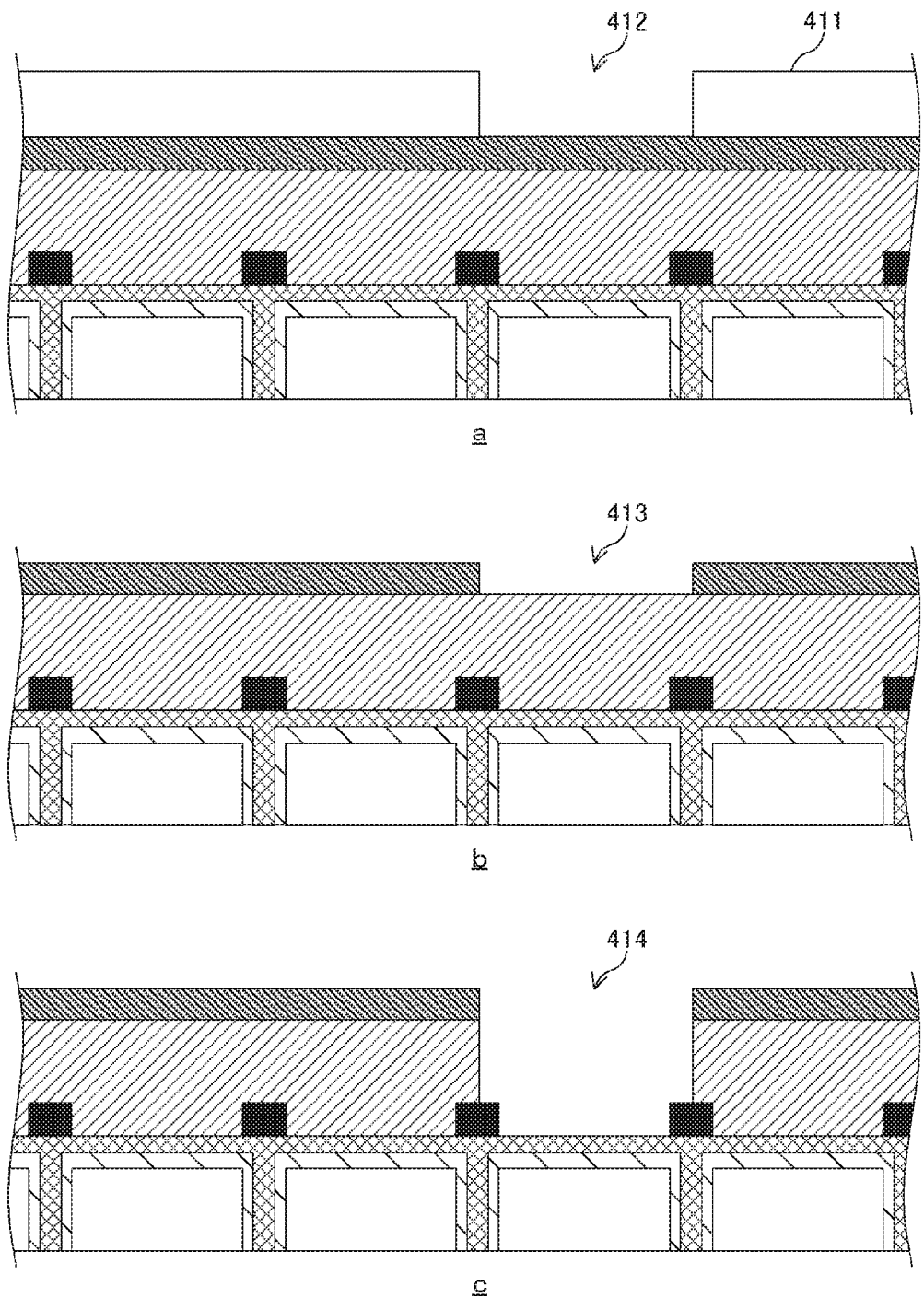
FIG. 8 illustrates an example of a method of manufacturing the imaging device according to the second embodiment of the present disclosure.
Figure 9:
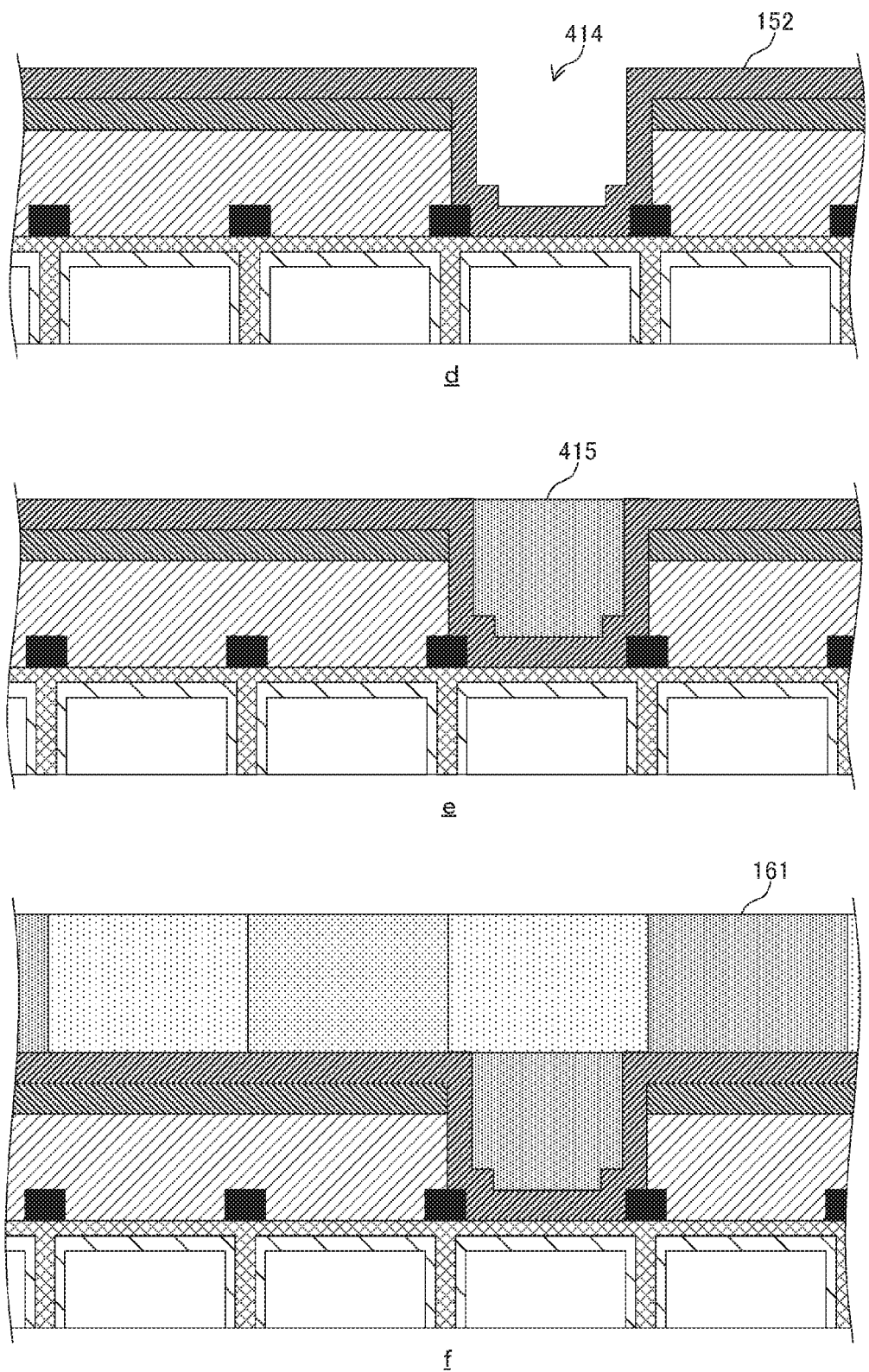
FIG. 9 illustrates the example of the method of manufacturing the imaging device according to the second embodiment of the present disclosure.

FIGS. 8 and 9 illustrate a method of manufacturing an imaging device according to the second embodiment of the present disclosure. A process of manufacturing the imaging device 1 described with reference to FIG. 7 is described using FIGS. 8 and 9. Note that FIG. 8 illustrates a process performed subsequently to c of FIG. 4. Note that the protective film 151 is assumed to be made of an inorganic material.

First, as illustrated in a of FIG. 8, a resist 411 is arranged on the surface of the protective film 151, and an opening 412 is formed. The resist 411 may have a thickness smaller than that of the resist 401 described with reference to d of FIG. 4.

Next, as illustrated in b of FIG. 8, etching is performed on the protective film 151 using the resist 411 as a mask. This etching can be performed using dry etching. The etching is performed until the resist 411 is removed. It is possible to use the thin resist 411 since etching is not performed on the infrared-light attenuation filter 141, which is different from the case of e of FIG. 5.

Next, as illustrated in c of FIG. 8, etching is performed on the infrared-light attenuation filter 141 using the protective film 151 as a mask. Dry etching is used as the etching, and it is possible to perform the etching on the condition that etching is selectively performed on the infrared-light attenuation filter 141. This makes it possible to form an opening 414. As described above, the use of the protective film 151 made of an inorganic material makes it possible to make a mask 411 used to form the infrared-light attenuation filter 141 thinner, and thus to make the manufacturing process simpler.

Next, as illustrated is d of FIG. 9, the protective film 152 is stacked. Accordingly, the protective film 152 is stacked on the surface of the protective film 151. The protective film 152 is arranged in the opening 414 at the same time. In other words, the protective film 152 is arranged on the surface of the insulation film 155 in the infrared-light pixel 200, and the protective film 152 is also arranged on the lateral face of the infrared-light attenuation filter 141 of the pixel 100.

Next, as illustrated in e of FIG. 9, a color filter 415 through which blue light is transmitted is formed in the opening 414.

Next, as illustrated is f of FIG. 9, the color filter 161 is formed. Next, the on-chip lens 171 is formed by the processes described with reference to h and i of FIG. 6.

The processes described above make it possible to manufacture the imaging device 1. The arrangement of the protective film 152 makes it possible to prevent an agglomerate from dissolving from the lateral face of the infrared-light attenuation filter 141 of the pixel 100 adjacent to the infrared-light pixel 200 in the process of e of FIG. 9. This results in being able to prevent the occurrence of a defect in the infrared-light attenuation filter 141 of the pixel 100 adjacent to the infrared-light pixel 200.

Except for the points described above, the imaging device 1 has a configuration similar to the configuration of the imaging device 1 described in the first embodiment of the present disclosure. Thus, the description is omitted.

As described above, in the imaging device 1 according to the second embodiment of the present disclosure, the arrangement of the protective film 152 makes it possible to protect the lateral face of the infrared-light attenuation filter 141, and thus to further prevent a reduction in image quality.

3. Third Embodiment

The imaging device 1 of the first embodiment described above uses the infrared-light attenuation filter 141 continuous at a boundary of the pixels 100. On the other hand, the imaging device 1 of a third embodiment of the present disclosure is different from the first embodiment described above in arranging, at the boundary of the pixels 100, a separation wall that separates the infrared-light attenuation filter 141.

Configuration of Pixel

Figure 10:
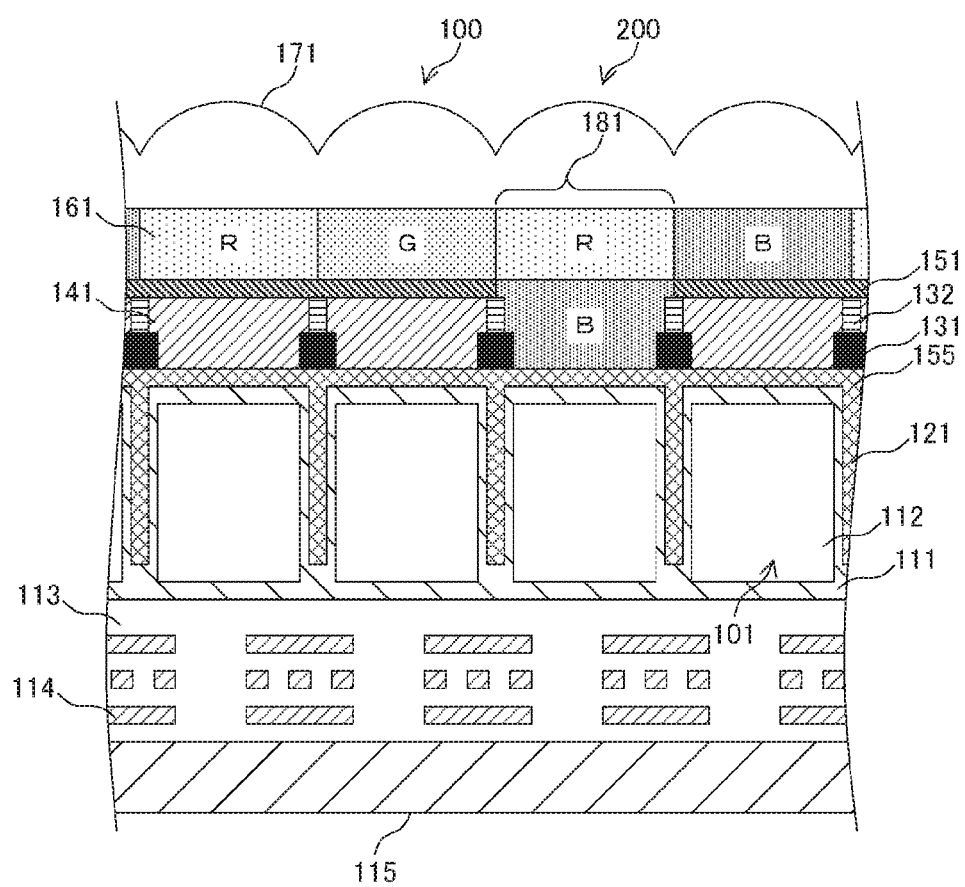
FIG. 10 illustrates a configuration example of a pixel according to a third embodiment of the present disclosure.

FIG. 10 illustrates a configuration example of a pixel according to the third embodiment of the present disclosure.

The pixel 100 in the figure is different from the pixel 100 described with reference to FIG. 2 in including a separation wall 132.

The separation wall 132 is arranged at a boundary of adjacent pixels 100 and at a boundary of the pixel 100 and the infrared-light pixel 200, and separates the infrared-light attenuation filter 141. The arrangement of the separation wall 132 between the pixels 100 makes it possible to attenuate light obliquely entering from an adjacent pixel 100, and thus to reduce the occurrence of color mixture. Further, the arrangement of the separation wall 132 between the pixel 100 and the infrared-light pixel 200 also makes it possible to protect the lateral face of the infrared-light attenuation filter 141 adjacent to the infrared-light pixel 200. The separation wall 132 may be made of, for example, oxide.

Note that the configuration of the imaging device 1 is not limited to this example. For example, the separation wall may also be arranged at a boundary of the pixels 100 in a region in which the color filter 161 is arranged.

Except for the points described above, the imaging device 1 has a configuration similar to the configuration of the imaging device 1 described in the first embodiment of the present disclosure. Thus, the description is omitted.

As described above, in the imaging device 1 according to the third embodiment of the present disclosure, the inclusion of the separation wall 132 makes it possible to reduce the occurrence of color mixture.

4. Fourth Embodiment

In the imaging device 1 of the first embodiment described above, the infrared-light attenuation filter 141 and the color filter 161 are stacked, in this order, on the surface of the insulation film 155 formed on the semiconductor substrate 111. On the other hand, the imaging device 1 of a fourth embodiment of the present disclosure is different from the first embodiment described above in arranging the infrared-light attenuation filter 141 and the color filter 161 in reverse order.

Configuration of Pixel

Figure 11:
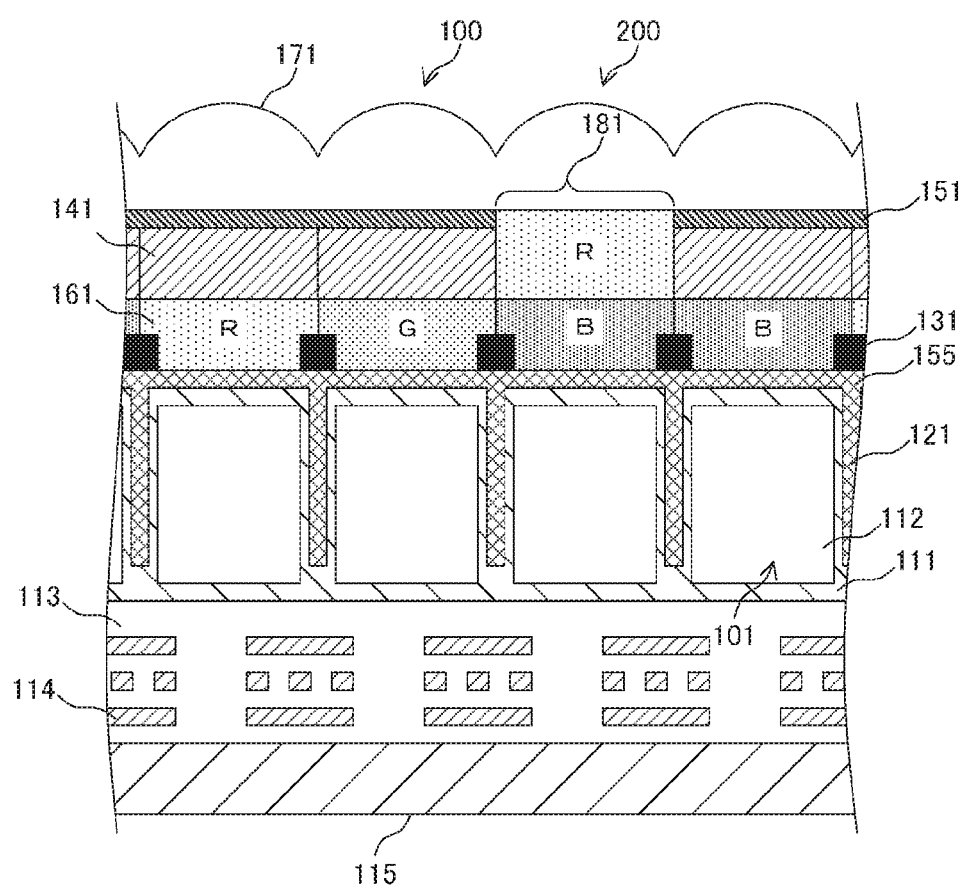
FIG. 11 illustrates a configuration example of a pixel according to a fourth embodiment of the present disclosure.

FIG. 11 illustrates a configuration example of a pixel according to the fourth embodiment of the present disclosure. The pixel 100 in the figure is different from the pixel 100 described with reference to FIG. 2 in arranging the color filter 161 and the infrared-light attenuation filter 141 on the surface of the insulation film 155 in this order.

Visible light transmitted through the infrared-light attenuation filter 141 enters the color filter 161 in the figure. The protective film 151 in the figure is capable of protecting the infrared-light attenuation filter 141 in the process of processing the infrared-light attenuation filter 141 and in the process of forming the on-chip lens 171.

Except for the points described above, the imaging device 1 has a configuration similar to the configuration of the imaging device 1 described in the first embodiment of the present disclosure. Thus, the description is omitted.

As described above, with respect to the imaging device 1 of the fourth embodiment of the present disclosure, it is possible to protect the infrared-light attenuation filter 141 in the imaging device 1 in which the color filter 161 and the infrared-light attenuation filter 141 are stacked in this order.

5. Fifth Embodiment

The imaging device 1 of the first embodiment described above uses stacked color filters as the visible-light attenuation filter 181 of the infrared-light pixel 200. On the other hand, the imaging device 1 of a fifth embodiment of the present disclosure is different from the first embodiment in using a single-layer visible-light attenuation filter.

Configuration of Pixel

Figure 12:
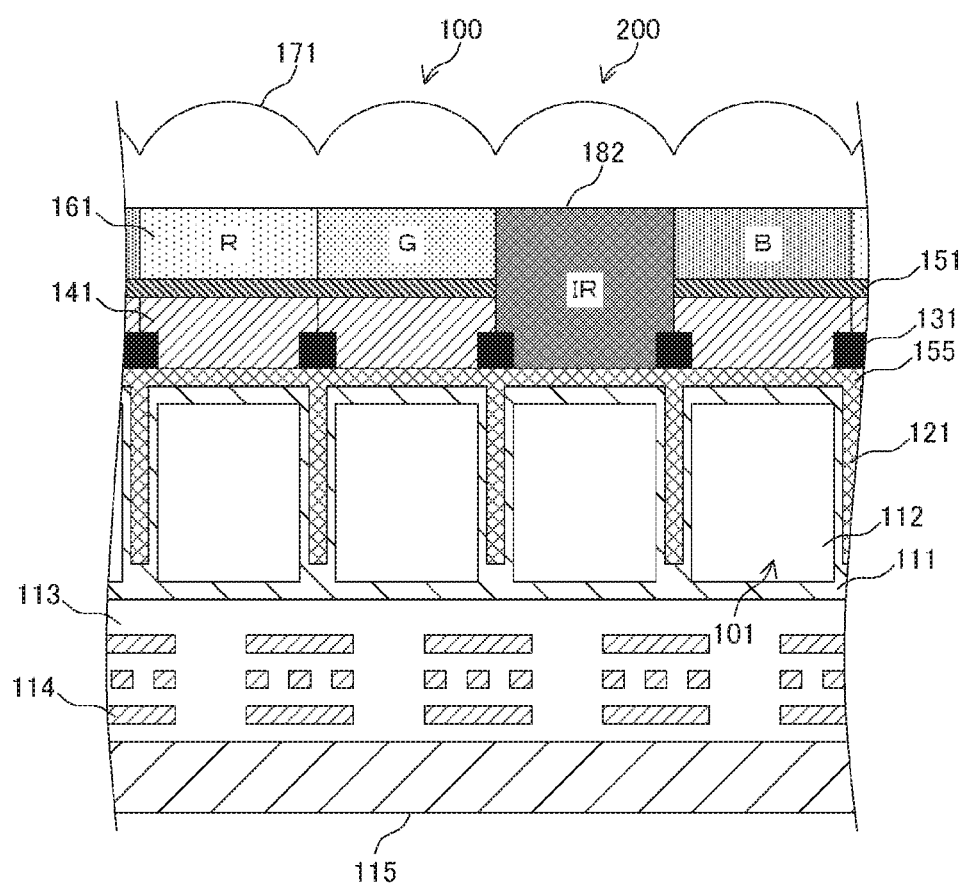
FIG. 12 illustrates a configuration example of a pixel according to a fifth embodiment of the present disclosure.

FIG. 12 illustrates a configuration example of a pixel according to the fifth embodiment of the present disclosure. The pixel 100 in the figure is different from the pixel 100 described with reference to FIG. 2 in including a visible-light attenuation filter 182 instead of the visible-light attenuation filter 181 in the infrared-light pixel 200.

The visible-light attenuation filter 182 in the figure is a filter that attenuates visible light and through which infrared light is transmitted. For example, a filter formed by mixing a plurality of coloring materials used for the color filter 161 may be used as the visible-light attenuation filter 182. It is also possible to protect the infrared-light attenuation filter 141 using the protective film 151 when the visible-light attenuation filter 182 is formed. Since the visible-light attenuation filter 182 has a single-layer configuration, it is possible to make the manufacturing process simpler, compared to the case of the visible-light attenuation filter 181 described with reference to FIG. 2.

Except for the points described above, the imaging device 1 has a configuration similar to the configuration of the imaging device 1 described in the first embodiment of the present disclosure. Thus, the description is omitted.

As described above, in the imaging device 1 according to the fourth embodiment of the present disclosure, it is possible to protect the infrared-light attenuation filter 141 using the single-layer visible-light attenuation filter 182.

6. Example of Application to Camera

The technology according to the present disclosure (the present technology) is applicable to various products. For example, the present technology may be implemented as an imaging device included in an image-capturing apparatus such as a camera.

Figure 13:
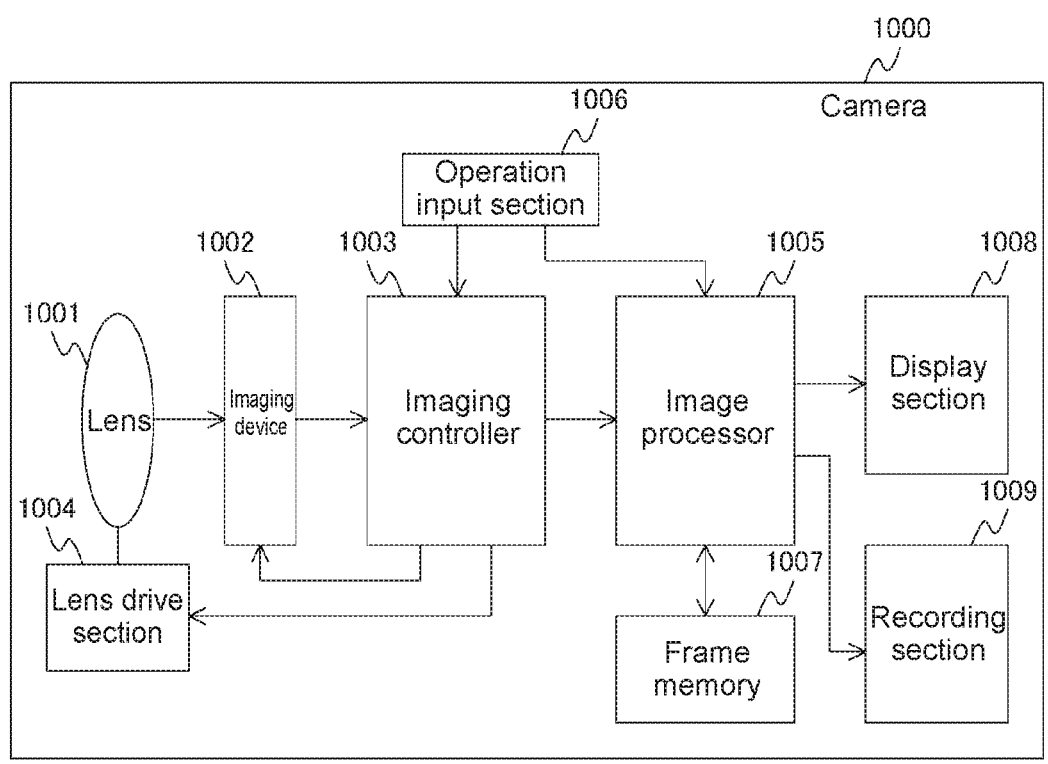
FIG. 13 is a block diagram illustrating an example of a schematic configuration of a camera that is an example of an image-capturing apparatus to which the present technology may be applied.

FIG. 13 is a block diagram illustrating an example of a schematic configuration of a camera that is an example of an image-capturing apparatus to which. the present technology may be applied. A camera 1000 in the figure includes a lens 1001, an imaging device 1002, an imaging controller 1003, a lens drive section 1004, an image processor 1005, an operation input section 1006, a frame memory 1007, a display section 1008, and a recording section 1009.

The lens 1001 is an imaging lens of the camera 1000. The lens 1001 collects light from a subject, and causes the collected light to enter the imaging device 1002 described later to form an image of the subject.

The imaging device 1002 is a semiconductor device that images the light from the subject that is collected by the lens 1001. The imaging device 1002 generates an analog image signal depending on irradiated light, converts the analog image signal into a digital image signal, and outputs the digital image signal.

The imaging controller 1003 controls imaging performed by the imaging device 1002. The imaging controller 1003 performs control of the imaging device 1002 by generating a control signal and outputting the control signal to the imaging device 1002. Further, the imaging controller 1003 is capable of performing autofocusing in the camera 1000 on the basis of the image signal output from the imaging device 1002. Here, the autofocusing is a system that detects a focal position of the lens 1001 and automatically adjusts the focal position. It is possible to use, as the autofocusing, a method of detecting a focal position by detecting an image-plane phase difference using a phase difference pixel arranged in the imaging device 1002 (image-plane-phase-difference autofocusing). Further, it is also possible to apply a method of detecting, as the focal position, a position. in which an image exhibits a highest contrast (contrast autofocusing). The imaging controller 1003 adjusts the position of the lens 1001 through the lens drive section 1004 on the basis of the detected focal position, and performs autofocusing. Note that the imaging controller 1003 can be implemented by, for example, a digital signal processor (DSP) that includes firmware.

The lens drive section 1004 drives the lens 1001 on the basis of control performed by the imaging controller 1003. The lens drive section 1004 is capable of driving the lens 1001 by changing the position of the lens 1001 using a built-in motor.

The image processor 1005 processes the image signal generated by the imaging device 1002. Examples of the processing include demosaicking that generates an image signal of a missing color from among image signals for respective pixels that respectively correspond to red, green, and blue; noise reduction that removes noise from an image signal; and encoding of an image signal. The image processor 1005 can be implemented by, for example, a microcomputer that includes firmware.

The operation input section 1006 receives an operation input from a user of the camera 1000. For example, it is possible to use a push button or a touch panel as the operation input section 1006. An operation input received by the operation input section 1006 is transmitted to the imaging controller 1003 and the image processor 1005. Thereafter, a process corresponding to the operation input such as a process of capturing an image of a subject, is started.

The frame memory 1007 is a memory that stores therein a frame that is an image signal for a single screen. The frame memory 1007 is controlled by the image processor 1005, and holds a frame in the process of image processing.

The display section 1008 displays thereon an image processed by the image processor 1005. For example, it is possible to use a liquid crystal panel for the display section 1008.

The recording section 1009 records therein an image processed by the image processor 1005. For example, it is possible to use a memory card or a hard disk as the recording section 1009.

The camera to which the present disclosure may be applied has been described above. The present technology may be applied to the imaging device 1002 from among the components described above. Specifically, the imaging device 1 described with reference to FIG. 1 is applicable to the imaging device 1002. The application of the imagine device 1 to the imaging device 1002 makes it possible to reduce the occurrence of color mixture, and thus to prevent a reduction in the quality of an image generated by the camera 1000.

Note that, although a camera has been described as an example, the technology according to the present disclosure may also be applied to, for example, a monitoring apparatus.

The camera to which the present disclosure may be applied has been described above. The present technology may be applied to the imaging device 1002 from among the components described above. Specifically, the imaging device 1 described with reference to FIG. 1 is applicable to the imaging device 1002. The application of the imaging device 1 to the imaging device 1002 makes it possible to prevent a reduction in the quality of an image generated by the camera 1000.

Note that, although a camera has been described as an example, the technology according to the present disclosure may also be applied to, for example, a monitoring apparatus.

Finally, the descriptions of the respective embodiments above are examples of the present disclosure, and the present disclosure is not limited to the embodiments described above. Thus, various modifications may of course be made depending on the design and the like without departing from the technical idea according to the present disclosure even in the case of an embodiment other than the embodiments described above.

Note that the present technology may also take the following configurations.
(1) An imaging device, including:
 a photoelectric converter that performs photoelectric conversion depending on incident light;
 an on-chip lens that collects the incident light into the photoelectric converter;
 a color filter through which infrared light and visible light of a specified wavelength from among the collected incident light are transmitted;
 an infrared-light attenuation filter that attenuates the infrared light from among the collected incident light and through which visible light from among the collected incident light is transmitted; and
 a protective film that is arranged adjacent to the infrared-light attenuation filter and protects the infrared-light attenuation filter.
(2) The imaging device according to (1), in which
 the protective film is arranged adjacent to the color filter, and
 the infrared-light attenuation filter attenuates the infrared light transmitted through the color filter.
(3) The imaging device according to (2), in which
 the protective film protects the infrared-light attenuation filter when the color filter is formed.
(4) The imaging device according to (2) or (3), in which
 the protective film has substantially the same refractive index as the color filter.
(5) The imaging device according to any one of (1) to (4), in which
 the protective film is arranged adjacent to the on-chip lens,
 the color filter is arranged adjacent to the infrared-light attenuation filter, and
 the visible light of the specified wavelength from among the incident light transmitted through the infrared-light attenuation filter, is transmitted through the color filter.
(6) The imaging device according to (5), in which
 the protective film protects the infrared-light attenuation. filter when the on-chip lens is formed.
(7) The imaging device according to any one of (1) to (6), further including:
 a pixel that includes the photoelectric converter, the on-chip lens, the color filter, the infrared-light attenuation filter, and the protective film; and
 an infrared-light pixel that includes an infrared-light transmission filter through which the infrared light from among the collected incident light is transmitted, the photoelectric converter, and the on-chip lens, in which
 the protective film is further arranged on a face of the infrared-light attenuation filter that is adjacent to the infrared-light pixel.
(8) The imaging device according to any one of (1) to (7), in which
 the protective film is made of an organic material.
(9) The imaging device according to any one of (1) to (7), in which
 the protective film is made of an inorganic material.
(10) The imaging device according to any one of (1) to (7), in which
 the protective film is formed by stacking an organic material and an inorganic material.

A method of manufacturing an imaging device, the method including:
 forming a photoelectric converter that performs photoelectric conversion depending on incident light;
 forming an on-chip lens that collects the incident light into the photoelectric converter;
 forming a color filter through which infrared light and visible light of a specified wavelength from among the collected incident light are transmitted;
 forming an infrared-light attenuation filter that attenuates the infrared light from among the collected incident light and through which visible light from among the collected incident light is transmitted; and
 forming a protective film that is arranged. adjacent to the infrared-light attenuation filter and protects the infrared-light attenuation filter.

REFERENCE SIGNS LIST

1 imaging device
10 pixel array
100 pixel
101 photoelectric converter
141 infrared-light attenuation filter
151, 152 protective film
161 color filter
171 on-chip lens
181, 182 visible-light attenuation filter
200 infrared-light pixel
1002 imaging device

What is claimed is:

1. An imaging device, comprising:
 a photoelectric converter that performs photoelectric conversion depending on incident light;
 an on-chip lens that collects the incident light into the photoelectric converter;
 a color filter through which infrared light and visible light of a specified wavelength from among the collected incident light are transmitted;
 an infrared-light attenuation filter that attenuates the infrared light from among the collected incident light and through which visible light from among the collected incident light is transmitted; and
 a protective film that is arranged adjacent to the infrared-light attenuation filter and protects the infrared-light attenuation filter,
 wherein the protective film is arranged adjacent to the color filter,
 wherein the infrared-light attenuation filter attenuates the infrared light transmitted through the color filter, and
 wherein the protective film has substantially a same refractive index as the color filter.

2. The imaging device according to claim 1, wherein the protective film protects the infrared-light attenuation filter when the color filter is formed.

3. The imaging device according to claim 1, further comprising:

a pixel that includes the photoelectric converter, the on-chip lens, the color filter, the infrared-light attenuation filter, and the protective film; and an infrared-light pixel that includes an infrared-light transmission filter through which the infrared light from among the collected incident light is transmitted, the photoelectric converter, and the on-chip lens, wherein the protective film is further arranged on a face of the infrared-light attenuation filter that is adjacent to the infrared-light pixel.

4. The imaging device according to claim 1, wherein the protective film is made of an organic material.

5. The imaging device according to claim 1, wherein the protective film is made of an inorganic material.

6. The imaging device according to claim 1, wherein the protective film is formed by stacking an organic material and an inorganic material.

7. A method of manufacturing an imaging device, the method comprising:

forming a photoelectric converter that performs photoelectric conversion depending on incident light;

forming an on-chip lens that collects the incident light into the photoelectric converter;

forming a color filter through which infrared light and visible light of a specified wavelength from among the collected incident light are transmitted;

forming an infrared-light attenuation filter that attenuates the infrared light from among the collected incident light and through which visible light from among the collected incident light is transmitted; and forming a protective film that is arranged adjacent to the infrared-light attenuation filter and protects the infrared-light attenuation filter, wherein the protective film is arranged adjacent to the color filter, wherein the infrared-light attenuation filter attenuates the infrared light transmitted through the color filter, and wherein the protective film has substantially a same refractive index as the color filter.

8. An imaging device, comprising:

a photoelectric converter that performs photoelectric conversion depending on incident light;

an on-chip lens that collects the incident light into the photoelectric converter;

a color filter through which infrared light and visible light of a specified wavelength from among the collected incident light are transmitted;

an infrared-light attenuation filter that attenuates the infrared light from among the collected incident light and through which visible light from among the collected incident light is transmitted; and a protective film that is arranged adjacent to the infrared-light attenuation filter and protects the infrared-light attenuation filter, wherein the protective film is formed by stacking an organic material and an inorganic material.

9. The imaging device according to claim 8, wherein the protective film is arranged adjacent to the color filter, and the infrared-light attenuation filter attenuates the infrared light transmitted through the color filter.

10. The imaging device according to claim 8, wherein the protective film has substantially a same refractive index as the color filter.

* * * * *